United States Patent [19]

Lane et al.

[11] 3,906,254

[45] Sept. 16, 1975

[54] COMPLEMENTARY FET PULSE LEVEL CONVERTER

[75] Inventors: Ralph D. Lane, Wappingers Falls; Richard A. Manning, Poughkeepsie, both of N.Y.

[73] Assignee: International Business Machines Corporation, Armonk, N.Y.

[22] Filed: Aug. 5, 1974

[21] Appl. No.: 494,946

[52] U.S. Cl. ................ 307/205; 307/214; 307/251; 307/264; 307/270; 307/304; 307/DIG. 1

[51] Int. Cl.[2] .................. H03K 19/08; H03K 3/353; H03K 17/60

[58] Field of Search ........... 307/205, 214, 251, 264, 307/268, 270, 279, 304, DIG. 1

[56] References Cited

UNITED STATES PATENTS

| | | | |
|---|---|---|---|
| 3,662,188 | 5/1972 | Williams | 307/205 |
| 3,676,700 | 7/1972 | Buchanan | 307/205 |
| 3,708,689 | 1/1973 | Lattin | 307/205 |
| 3,739,193 | 6/1973 | Pryor | 307/205 |
| 3,739,200 | 6/1973 | D'Agostino | 307/251 |
| 3,801,831 | 4/1974 | Dame | 307/251 |
| 3,812,384 | 5/1974 | Skorup | 307/214 |

*Primary Examiner*—Stanley D. Miller, Jr.
*Attorney, Agent, or Firm*—Sughrue, Rothwell, Mion, Zinn & Macpeak

[57] ABSTRACT

An interfacing circuit for restoring voltage pulses to a desired fixed level. The circuit is particularly adapted to CMOS technology and includes features which result in rapid output rise and fall times, latching of the output voltage level, and isolation of the input following transition of the input voltage between its respective final levels. The circuit is also relatively insensitive to noise since it requires voltage transitions greater than the FET threshold levels to fully activate and switch the latching circuit means.

6 Claims, 1 Drawing Figure

PATENTED SEP 16 1975
3,906,254
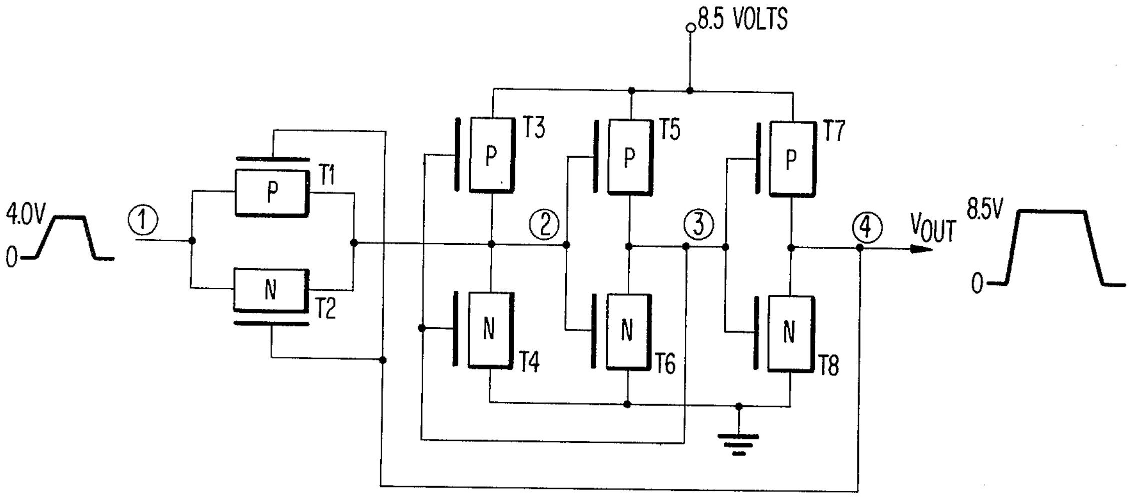

COMPLEMENTARY FET PULSE LEVEL CONVERTER

BACKGROUND OF THE INVENTION

The invention is in the field of interfacing circuits adapted to interface between circuits which require low voltage pulses and circuits which require high voltage pulses. The invention is particularly adapted to CMOS technology, which is well known in the art and has advantages relating to cost of manufacture, circuit packing density and negligable quiescent power dissipation.

In many large scale systems utilizing a plurality of electronic circuits it is often the case that some circuits have different logic voltage requirements than others. For example, in one circuit logic 0 and 1 may be represented by ground and +4 volts, respectively, whereas in a second circuit logic 0 and 1 may be represented by 0 and +8.5 volts, respectively. These examples are only given herein to illustrate the problem and are not intended as the only logic values suitable in circuits. If the logic information is to be fed from the first circuit to the second it is necessary to provide an interfacing circuit which operates to restore the voltage transitions to the level of the second circuit.

In large scale integrated circuits using CMOS technology it is conventional to use series connected p-channel and n-channel FET's as the basic part of the interfacing circuit. However, there are several problems connected with the use of such circuit. First, the circuit is usually activated by a voltage transition at the input which exceeds the threshold level, $V_T$, of one of the input field effect devices. Since $V_T$ is typically quite small it can be seen that transitions at the input caused by relatively low level noise will activate the circuit and appear at the output. Secondly, at the low level voltage state, e.g., grounded output level, both P and N channel series connected FET's are conducting and a substantial power drain occurs. Furthermore, it is necessary to fabricate the circuit so that the resistance of the p-channel device is much larger than the resistance of the n-channel device when both are conducting. This increases problems in the fabrication of the integrated circuitry.

An interfacing circuit using CMOS technology is shown in U.S. Pat. No. 3,739,200. In the circuit shown in the latter patent a path is provided between the high voltage power supply and ground during the low voltage output state thus causing unproductive power drain. Also, the circuit is activated when the input varies a small amount, (enough to overcome the threshold voltage of FET 24 shown in FIG. 2), and, consequently, the circuit is sensitive to low amplitude noise at the input.

SUMMARY OF THE INVENTION

In accordance with the present invention an interfacing circuit is provided, constructed according to CMOS technology, which results in reduced power drain during transition, faster operating speeds, and reduced sensitivity to noise at the input.

The output portion of the circuit is a series connected pair of complementary FET devices having their gates tied together. A latching circuit is connected to the latter gate terminals and operates to cause rapid transition at the gate terminals. The rapid transition reduces the time that both series connected FET's are conducting and therefore reduces unproductive power drain. The latching circuit also holds the gate voltage at its final value until the occurrence of another voltage transition. An input isolation circuit is also provided between the input terminal of the circuit and the input of the latching circuit. The latter isolation circuit is preconditioned by a feedback connection from the circuit output so as to be ready to pass the next voltage transition to the latch input. Also, the isolation circuit operates to isolate the input terminal from the latch except during input voltage transition. The latter feature prevents D.C. current from flowing back into the input terminal.

BRIEF DESCRIPTION OF THE DRAWINGS

The only drawing illustrates a schematic diagram of a preferred embodiment of the present invention.

DETAILED DESCRIPTION OF THE PREFERRED EMBODIMENT

The preferred embodiment will be described in connection with the example mentioned in the background section above, i.e., the circuit interfaces between voltage transitions of 0–4 volts at the input and 0–8.5 volts at the output. The elements T1 – T8 are, in the preferred embodiment, conventional MOSFET devices of the enhancement type and are preferably constructed in integrated circuit form on a single substrate. The symbols *p* and *n* represent, respectively, p-channel MOSFET and n-channel MOSFET.

The circuit shown in the drawing comprises an input circuit, a latching circuit and an output circuit. The input circuit comprises parallel connected FET's T1 and T2 connected between node 1 and node 2. Node 1 is the interfacing circuit input node, and node 2 is the latching circuit input node. The latching circuit comprises FET's T3 – T6 connected between a power supply terminal shown as +8.5 volts and a reference terminal shown grounded. The input to the latching circuit is at node 2 and the output of the latching circuit is at node 3. The output circuit comprises series connected FET elements T7 and T8 connected through their drain-source leads across the power supply terminal and the reference terminal. The gate leads of FET's T7 and T8 are connected to latching circuit output node 3, and the interconnection of T7 and T8 is connected to the interfacing circuit output node 4. The output is fed back to the gates of FET's T1 and T2. As will be understood by those of ordinary skill in the art, all nodes have stray or interelectrode capacitances. Furthermore, the capacitance at output node 4 may be a combination of stray and interelectrode capacitance and discrete capacitance.

The operation of the circuit will now be described with the following assumed starting conditions. Nodes 1 and 4 are at zero volts, node 3 is at approximately +8.5 volts and node 2 is at ground. At this point node 1 is isolated from node 2 since the zero voltage on all electrodes of T1 and T2 causes those transistors to be "off". Assume next that node 1 rises to 4.0 volts. As node 1 rises above the threshold voltage $V_T$ of T1, the latter transistor becomes conductive and node 2 begins charging positively towards +4.0 volts through T1. As the gate voltage of T5 and T6 begins to rise, T5 starts to turn-off and T6 starts to turn-on. Node 3 begins to discharge through T6. The decreasing voltage on node 3 starts to turn-on on T3 and turn-off T4 resulting in further and more rapid voltage increase at node 2 due to the current into node 2 from the power supply terminal. Thus, it can be seen that the feedback from node 3 to the gates of T3 and T4 causes node 2 to rapidly rise to +8.5 volts and node 3 to rapidly discharge to ground. The rapid discharge of node 3 also turns-off hard T8 and turns-on hard T7 to cause the output node 4 to rapidly rise to +8.5 volts.

As can be seen the transition at the output is very rapid because of the feedback in the latching circuit which enhances the charging of node 2. However, a low level noise voltage at the input would not cause the output to rise to the high level for the following reason. Until the voltage at node 2 rises high enough, e.g., 2 volts, there will still be heavy conductance through T5 and node 3 will remain charged to a relatively high voltage level. For input transitions below the assumed level of 2 volts the latch will not switch states.

At the end of the transition node 4 will be at +8.5 volts and node 1 will be at +4 volts. T1 will be cut-off by the large voltage on its gate electrode. T2 will also be cut-off even though its gate voltage will be 4.5 volts higher than that at node 1. This is due to the fact that the +4 volts at node 1 causes a large source to substrate reverse bias on T2 which in turn causes a substantial increase in the threshold or turn-on voltage of T2. Under the stated conditions the 4.5 volt differential between the source and gate of T2 will be insufficient to turn-on T2. Consequently, node 1 will be isolated from the rest of the circuit. However, T2 is preconditioned by the +8.5 volts on its gate to be ready for the next voltage transition from +4.0 to zero at node 1.

When the voltage at node 1 drops to zero, the gate to source voltage on T2 increases, the reverse bias on the source-substrate decreases, the gate-source threshold decreases, and the FET T2 becomes immediately conductive. Node 2 starts discharging through T2 thereby lowering the gate voltage on T5 and T6. T5 starts to turn-on and T6 starts to turn-off. Node 3 begins charging via T5 causing an increase in the voltage at the gates of T3 and T4. T3 starts to turn-off and T4 starts to turn-on. The latter action causes faster discharge of node 2 through T4 to ground. This increases the rate of charging of node 3. Thus, the feedback in the latch causes a rapid and substantially complete discharge of node 2 and a rapid rise of the voltage at node 3 to +8.5 volts. The rapid rise of the voltage at node 3 to +8.5 volts turns-on hard T8 and turns-off hard T7 thus causing a rapid discharge of node 4.

At the end of the transition nodes 1 and 4 will be at zero volts, and FET's T1 and T2 will be cut-off by the feedback connection to isolate the input node from the rest of the circuit.

The circuit is also insensitive to a negative voltage excursion at node 1 due to low level noise because unless the input voltage drops substantially below 4.0 volts, T6 will not cut-off sufficiently, T5 will not turn-on sufficiently and the voltage at node 3 will remain low.

What is claimed is:

1. An interfacing circuit adapted to receive input voltage transitions of a relatively low level and provide corresponding output voltage transitions of a predetermined level comprising:

a. an output node for said interfacing circuit and an input node for said interfacing circuit, b. a first n-channel FET and a second p-channel FET connected in series via their respective drain-source leads between a terminal of a power supply and a terminal at a reference potential, the series connection between said first and second FET's being connected to said output node, c. latching circuit means having input and output nodes and being connected between said power supply and reference potentials, said latching means comprises;

i. inverter means responsive to a variation in voltage at said latching circuit input node in a first and second direction to cause a variation in voltage at said latching circuit output node in a second and first direction, respectively, and ii. voltage variation increasing means responsive to the voltage connected at said latching circuit output node for increasing the variation of voltage at said latching circuit input node in the direction of initial variation at said latching circuit input node, whereby the further variation of the voltage at said latching circuit input node hard drives said inverter means to cause the voltage at said latching circuit output node to rapidly reach first or second predetermined final voltage values depending on the direction of variation of voltage at said latching circuit input and output nodes, d. means connecting said output node of said latching circuit means to the gate leads of said first and second FET's, whereby the latching means output node voltage of said first predetermined value drives one of said FET's on hard and drives the other FET off hard, and said second predetermined voltage value drives said other FET on hard and said one FET off hard, and e. input means connecting said interfacing circuit input node to said latching circuit input node.

2. The interfacing circuit of claim 1 wherein said input means comprises:

a. first circuit element means connected between said interfacing circuit input node and said latching circuit input node and responsive to a low voltage level at said interfacing circuit output node for providing a low resistance current path between said two input nodes, and b. second circuit element means connected between said two input circuit nodes and responsive to a high voltage level at said interfacing circuit output node for providing a low resistance current path between said two input nodes, and wherein said interfacing circuit further comprises a feedback connection between said interfacing circuit output node and said first and second circuit elements.

3. The interfacing circuit as claimed in claim 1 wherein said inverter means comprises, a third n-channel FET and a fourth p-channel FET connected in series via their drain-source leads between said power supply and reference terminals, said third and fourth FET's having their gate leads connected together and to said latching circuit input node, the interconnection of said third and fourth FET's in said series connection being connected to said latching circuit output node.

4. The interfacing circuit as claimed in claim 3 wherein said voltage variation increasing means comprises a fifth n-channel FET and a sixth p-channel FET connected in series via their drain-source leads between said power supply and reference terminals, said fifth and sixth FET's having their gates connected together and to said latching circuit output node, the interconnection of said fifth and sixth FET's in said series connection being connected to said latching circuit input node.

5. The interfacing circuit of claim 4 wherein said input means comprises:

a. a seventh n-channel FET connected via its source-drain leads between said interfacing circuit input node and said latching circuit input node, b. an eighth p-channel FET connected via its source-drain leads between said interfacing circuit input node and said latching circuit input node, and c. a connection between said interfacing circuit output node and the gate leads of said seventh and eighth FET's.

6. The interfacing circuit of claim 1 wherein said input means comprises means for isolating the interfacing circuit input node from the latching circuit input node at all times other than during the transition of said input and output voltages, and feedback means connected between said means for isolating and said interfacing circuit output node for preconditioning said means for isolating to provide a low resistance current path between said interfacing circuit input node and said latching circuit input node as soon as a transition occurs in the voltage at said interfacing circuit input node.

* * * * *